United States Patent
Jain et al.

(10) Patent No.: US 11,935,554 B2
(45) Date of Patent: Mar. 19, 2024

(54) SYSTEMS AND METHODS FOR ADJUSTING CLARITY OF AN AUDIO OUTPUT

(71) Applicant: Bose Corporation, Framingham, MA (US)

(72) Inventors: Ankita D. Jain, Watertown, MA (US); Cristian Hera, Lancaster, MA (US)

(73) Assignee: Bose Corporation, Framingham, MA (US)

( * ) Notice: Subject to any disclaimer, the term of this patent is extended or adjusted under 35 U.S.C. 154(b) by 15 days.

(21) Appl. No.: 17/677,776

(22) Filed: Feb. 22, 2022

(65) Prior Publication Data

US 2023/0267946 A1     Aug. 24, 2023

(51) Int. Cl.
| | |
|---|---|
| *H04B 1/00* | (2006.01) |
| *G10L 21/034* | (2013.01) |
| *G10L 21/0364* | (2013.01) |
| *G10L 25/78* | (2013.01) |
| *H04R 3/00* | (2006.01) |
| *H03G 3/30* | (2006.01) |
| *H03G 7/00* | (2006.01) |

(52) U.S. Cl.
CPC ........ *G10L 21/0364* (2013.01); *G10L 21/034* (2013.01); *G10L 25/78* (2013.01); *H04R 3/00* (2013.01); *H03G 3/3005* (2013.01); *H04R 2430/01* (2013.01); *H04R 2499/13* (2013.01)

(58) Field of Classification Search
CPC ... G10L 21/0364; G10L 21/034; G10L 25/78; H04R 3/00; H04R 2430/01; H04R 2499/13; H03G 3/3005

USPC .................................................... 381/86, 106
See application file for complete search history.

(56) References Cited

U.S. PATENT DOCUMENTS

| | | | |
|---|---|---|---|
| 2005/0114127 A1 | 5/2005 | Rankovic | |
| 2011/0293103 A1* | 12/2011 | Park .................. | G10K 11/17854 381/57 |
| 2014/0064509 A1 | 3/2014 | Su et al. | |
| 2015/0281853 A1 | 10/2015 | Eisner et al. | |
| 2016/0310736 A1* | 10/2016 | Calle ................... | A61N 1/0541 |
| 2022/0277759 A1* | 9/2022 | Gaalaas ............... | G10L 21/034 |

OTHER PUBLICATIONS

International Search Report and the Written Opinion of the International Searching Authority, International Application No. PCT/US2023/013508, pp. 1-8, dated May 11, 2023.

* cited by examiner

*Primary Examiner* — Ammar T Hamid
(74) *Attorney, Agent, or Firm* — Bond, Schoeneck & King, PLLC

(57) ABSTRACT

A method for adjusting the clarity of an audio output in a changing environment, including: receiving a content signal; applying a customized gain to the content signal; and outputting the content signal with the customized gain to at least one speaker for transduction to an acoustic signal, wherein the customized gain is applied on a per frequency bin basis such that frequencies of a lesser magnitude are enhanced with respect to frequencies of a greater magnitude and an intelligibility of the acoustic signal is set approximately at a desired level, wherein the customized gain is determined according to at least one of a gain applied to the content signal, a bandwidth of the content signal, and a content type encoded by the content signal.

18 Claims, 13 Drawing Sheets

SYSTEMS AND METHODS FOR ADJUSTING CLARITY OF AN AUDIO OUTPUT

BACKGROUND

This disclosure generally relates to systems and method for adjusting the clarity of an audio output.

SUMMARY

All examples and features mentioned below can be combined in any technically possible way.

According to an aspect, a method for adjusting the clarity of an audio output in a changing environment, includes: receiving a content signal; applying a customized gain to the content signal; and outputting the content signal with the customized gain to at least one speaker for transduction to an acoustic signal, wherein the customized gain is applied on a per frequency bin basis such that frequencies of a lesser magnitude are enhanced with respect to frequencies of a greater magnitude and that an intelligibility of the acoustic signal is set approximately at a desired level, wherein the customized gain is determined according to at least one of a gain applied to the content signal, a bandwidth of the content signal, and a content type encoded by the content signal.

In an example, the customized gain is based on a dynamic range compression.

In an example, the customized gain is further based on an equalization.

In an example, the equalization is a spectral tilt.

In an example, the gain applied to the content signal is set according to a volume control.

In an example, the audio output is generated within a vehicle cabin, wherein the gain is set, at least in part, according to road noise within the vehicle cabin and according to a volume control.

In an example, the gain set according to the road noise within the vehicle cabin is comprised of a set of frequency-dependent gain adjustments.

In an example, the dynamic range compression is only performed within the bandwidth of the signal.

In an example, the content type is one of music or a spoken-word output.

In an example, the content type is detected according to a voice-activity detection algorithm.

According to an aspect, a non-transitory storage medium comprising program code that, when executed by a processor, adjusts the clarity of an audio output in a changing environment, the program code includes the steps of: receiving a content signal; applying a customized gain to the content signal; and outputting the content signal with the customized gain to at least one speaker for transduction to an acoustic signal, wherein the customized gain is applied on a per frequency bin basis such that frequencies of a lesser magnitude are enhanced with respect to frequencies of a greater magnitude and that an intelligibility of the acoustic signal is set approximately at a desired level, wherein the customized gain is determined according to at least one of a gain applied to the content signal, a bandwidth of the content signal, and a content type encoded by the content signal.

In an example, the customized gain is based on a dynamic range compression.

In an example, the customized gain is further based on an equalization.

In an example, the equalization is a spectral tilt.

In an example, the gain applied to the content signal is set according to a volume control.

In an example, the audio output is generated within a vehicle cabin, wherein the gain is set, at least in part, according to road noise within the vehicle cabin and according to a volume control.

In an example, the gain set according to the road noise within the vehicle cabin is comprised of a set of frequency-dependent gain adjustments.

In an example, the dynamic range compression is only performed within the bandwidth of the signal.

In an example, the content type is one of music or a spoken-word output.

In an example, the content type is detected according to a voice-activity detection algorithm.

The details of one or more implementations are set forth in the accompanying drawings and the description below. Other features, objects, and advantages will be apparent from the description and the drawings, and from the claims.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the various aspects.

DETAILED DESCRIPTION

Figure 1:
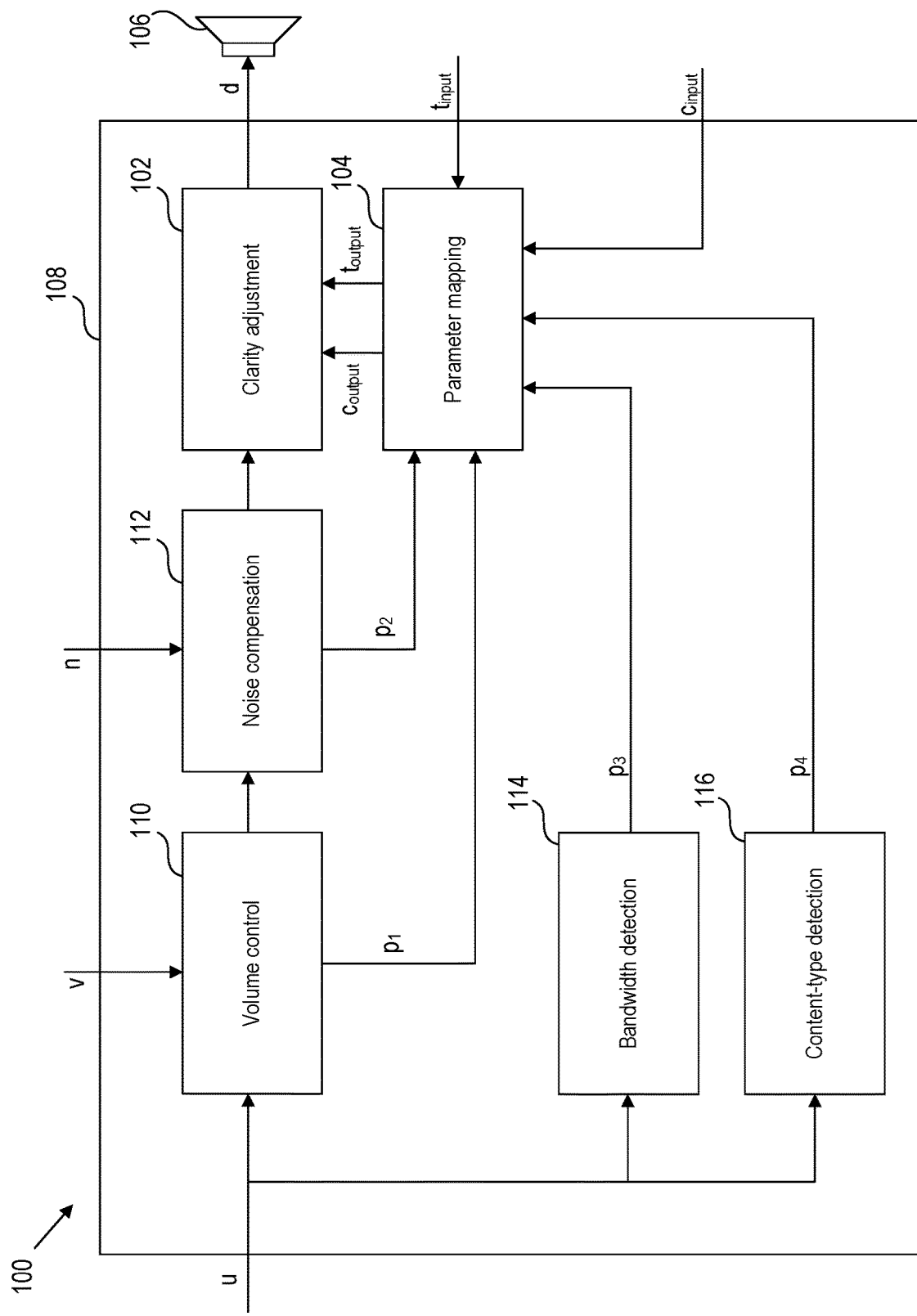
FIG. 1 depicts a block diagram of a controller, implementing an audio processing chain, and a speaker, according to an example.

Spoken word audio outputs provided within a noisy context, such as within a vehicle cabin, can often be quite difficult to understand. This difficulty is often compounded by the fact that such noisy environments typically increase the cognitive load of a user. Driving for example, requires some level of concentration, detracting from the user's ability to focus on and understand the words within a particular spoken word output. This inability to understand words in a spoken word output can be aggravated by the low bandwidth of certain spoken word outputs, such as cell phone calls, that can further reduce intelligibility. It is desirable, therefore, to process the audio signal in a manner to increase the clarity of spoken word outputs in the context of a dynamic environment.

Clarity, as used in this disclosure, generally refers to the intelligibility of spoken word audio output from a speaker or set of speakers (e.g., a speaker array). While there is necessarily some subjective perception involved with clarity, it can be measured by querying what percentage of the words within a spoken word output were intelligible to a given listener. This measurement can be made objective by averaging the responses of a set of listeners to the same query, although other objective measures of clarity are known and can be used.

A clarity input, as used in this disclosure, refers to a default or user-defined input (input to an audio system, such as in a vehicle) of desired intelligibility of an audio output. Further, the clarity input can be adjustable by the user and can be presented to the user as an input titled "intelligibility," "clarity of spoken word audio," "vocal clarity," or the like.

The clarity of the audio output can be adjusted to approximate (i.e., to within a predetermined range of bounds) the clarity input by applying a customized gain based upon various conditions, on a per frequency bin basis (e.g., having a varying gain for each frequency bin), such that softer sounds may be enhanced (e.g., brought up in level or volume relative to louder sounds), and/or louder sounds reduced (e.g., brought down in level or volume relative to softer sounds). The degree of adjustment, that is, processing, applied to the audio signal to approximate the clarity input will be referred to throughout this disclosure as the clarity setting, with a higher clarity setting representing a larger adjustment made to the signal to increase clarity and lower clarity setting representing a smaller adjustment to the signal.

While adjusting the clarity setting to the highest amount results in the greatest improvement to intelligibility, it comes at a penalty, often sounding stilted, robotic, or with less audio richness. Thus, the clarity input represents the amount of trade-off the user is willing to make between being able to hear words at a given audio signal level and the tonal balance change in the audio signal brought about by the resulting clarity setting. For example, users with mild to moderate hearing difficulty may be willing to accept a higher degree of altered tonal balance with the benefit of greater intelligibility at lower audio levels as compared to individuals with perfect hearing.

But even for users with hearing difficulty, it is typically desirable to apply a clarity setting that results in the desired intelligibility (i.e., corresponding to the clarity input) of the spoken word output so that the resulting audio output is not overcorrected. But the amount of adjustment required to maintain the output at the desired intelligibility is context specific, influenced by a variety of factors, as alluded to above, such as the noise within the ambient environment, the volume of the spoken word output, the amount and character of upstream processing to the input signal, the quality of the signal, and the type of content produced within the signal.

Within such a dynamic environment, to provide an audio output with intelligibility provided at a desired level, the clarity setting must then be adjusted to adapt to the context. For example, within a vehicle cabin, as the car picks up speed and the noise within the cabin increases, the signal to noise ratio within the cabin decreases, necessitating an adjustment in the clarity setting if the intelligibility of a spoken word output is to be maintained. It is therefore desirable to automatically determine a clarity setting depending on a set of predetermined factors.

FIG. 1 depicts a block diagram of an audio system 100 processing chain that implements a context-specific clarity setting at clarity adjustment 102. As described above, the clarity of the audio output d can be adjusted by clarity adjustment 102 to a implement clarity setting that approximates (i.e., to within a predetermined range of bounds) the clarity input by applying a customized gain based upon various conditions, on a per frequency bin basis (e.g., having a varying gain for each frequency bin), such that softer sounds may be enhanced (e.g., brought up in level or volume relative to louder sounds), and/or louder sounds reduced (e.g., brought down in level or volume relative to softer sounds). The clarity setting applied by clarity adjustment 102 is determined by parameters $c_{output}$ received from parameter mapping 104, which takes into account other processes performed on the content signal u (such as one or more gain adjustments) and the characteristics of the input content signal (such as bandwidth and content type) to implement the clarity setting that determines the intelligibility of the output signal d, as transduced by speaker 106 or set of speakers (e.g., organized into an array) to a desired level (as set by a default setting or user defined setting) within the context of a dynamic environment and/or input content signal. (To the extent that the clarity of the audio output d is described in this disclosure, it should be understood to refer to the clarity of the resulting acoustic output of the speaker transducing audio output d. Further, the output signal d can further include additional adjustments to prepare the signal for transduction, such as beamforming, routing, etc. Generally, those processes performed on the signal after clarity adjustment 102 are those that do not impact the clarity of the audio signal.)

The desired level is determined by a default setting or by received user input $c_{input}$. The clarity setting can be further tuned through a user-defined fine tune input $t_{input}$ to tailor the clarity setting to the hearing needs of a particular user. In this example, the parameters that adjust the clarity setting can thus further include a fine tune output, $t_{output}$, from parameter mapping 104.

In an example, the audio system 100 signal processing chain can be implemented by a controller 108, comprising one or more processors in conjunction with any associated hardware. In an example, some or all the steps performed by the audio processing chain can be stored in one or more non-transitory storage media and executed by the one or more processors. In certain examples, portions of the audio system processing chain, such as the volume control or noise compensation (as described below) can be performed in a processor or hardware (circuitry) separate from controller 108. The controller 108 and the speaker 106 or set of speakers can be disposed within a vehicle and configured to produce the audio output in the vehicle cabin. However, in alternative examples, controller 108 and speaker or set of speakers 106 can be disposed elsewhere, such as within a soundbar or any device producing an audio output to a dynamic environment.

Figure 2:
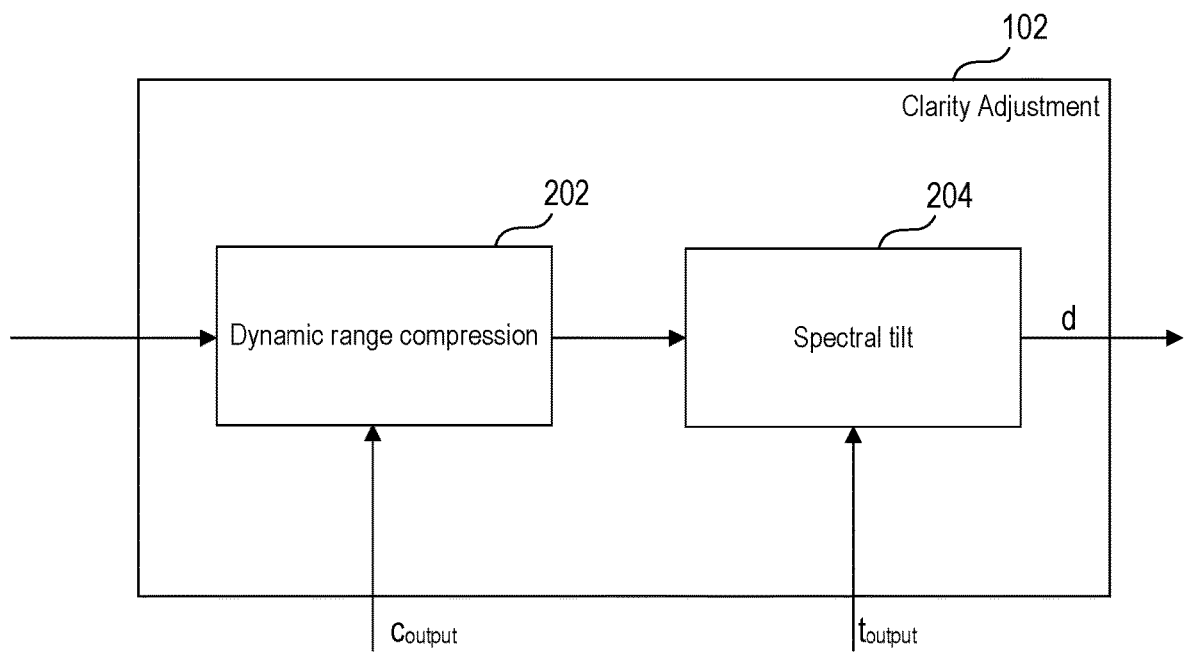
FIG. 2 depicts a block diagram of a clarity adjustment, according to an example.

An example of clarity adjustment 102 is shown in FIG. 2, which includes dynamic range compression 202 and spectral tilt 204. In this example, clarity setting can be adjusted by changing the parameters of a dynamic range compression—e.g., the implemented thresholds, associated gain reductions, etc.—in a manner designed to improve the intelligibility of the spoken word output. In general, a higher compression of dynamic range, which reduces the differences in sound levels between louder and softer content, is associated with greater intelligibility of speech. The gain applied within the frequency bin can be determined, at least in part, by a characteristic (typically the peak or the power) of the input signal, and can be accomplished through a downward compression, an upward compression, or both. A downward compression reduces gain when the signal exceeds a predetermined threshold, while an upward compression increases gain when the signal falls below a predetermined threshold. Digitally, dynamic range compression is done on a frequency-bin basis by implementing the compression, for a given frame, according to energy within the frequency bin. Dynamic range compression is generally known and so a more detailed description is omitted in this disclosure.

In this example, the clarity setting is adjusted by $c_{input}$ between a setting that applies no dynamic range compression, and thus does not change the input signal, to a full clarity setting that applies the highest predetermined dynamic range adjustment and results in the highest degree of clarity of a spoken word output. A change in one direction can be associated with increased intelligibility while a change in the other direction can be associated with decreased intelligibility. Stated differently, in this example, adjusting to higher clarity setting adjusts the parameters of the applied dynamic range compression to result in increasing the intelligibility of the speech.

While a higher clarity setting can mean that more compression is applied to certain frequencies, it does not always follow that a higher compression is applied to all frequencies. Rather, higher clarity settings result in dynamic range compression parameters that shape the output signal to result in greater intelligibility of speech. Such dynamic range compression parameters can be determined theoretically (for example, by inverting the average hearing threshold curve) or empirically (for example by, querying users on hearing improvements made with different compression parameters), or a combination of theoretical and empirical approaches.

Figure 3A:
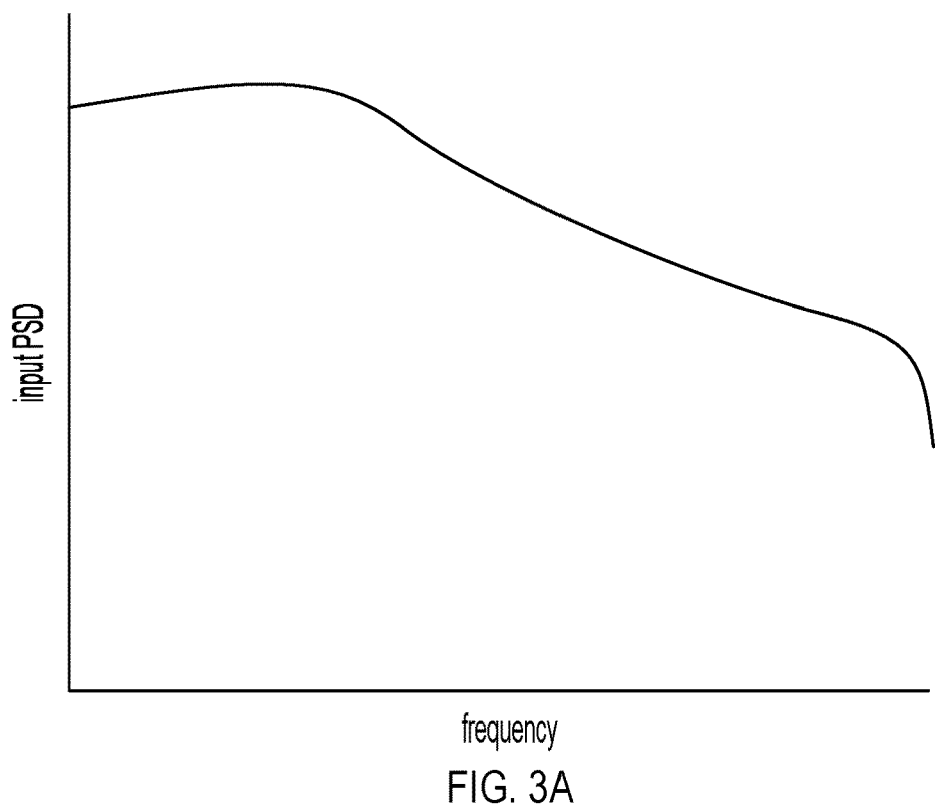
FIG. 3A depicts a plot depicting an input power spectral density across frequency, according to an example.
Figure 3B:
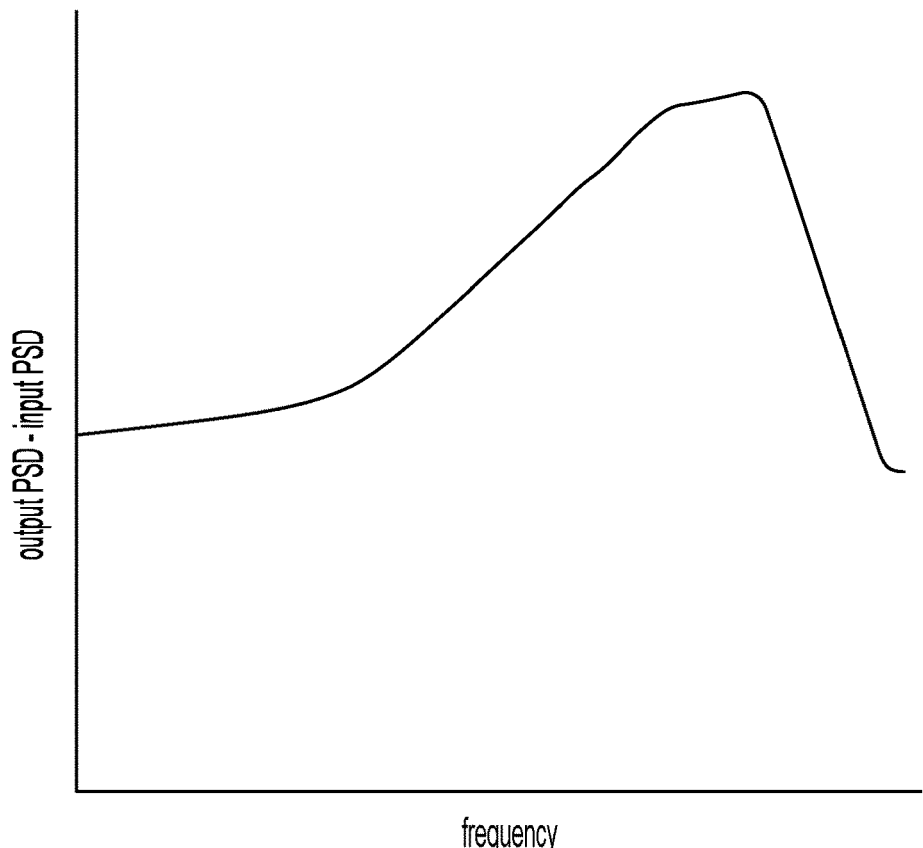
FIG. 3B depicts a plot of a difference between an output spectral density of a dynamic range compression and the input power spectral density across frequency, according to an example.

FIGS. 3A and 3B depict an example dynamic range compression on a sample input signal. More particularly, FIG. 3A depicts the input power spectral density (PSD) of a sample input signal over frequency. FIB. 3B depicts the difference between the input PSD and the output PSD of the dynamic range compression 202 to demonstrate the gain adjustment enacted by dynamic range compression 202. As shown, frequency bins having higher magnitudes receive no or little gain adjustment; whereas frequency bins having comparatively low magnitudes, are, through upward compression, increased such that quiet sounds are magnified with respect to loud sounds.

Further, while a dynamic range compression that improves intelligibility for an average user can be determined theoretically or empirically, the resulting dynamic range compression will not improve intelligibility for every user. Certain users might experience hearing difficulty in atypical ways and a dynamic compression tailored for the average user will not address the way in which a given user perceives spoken word content.

Figure 4:
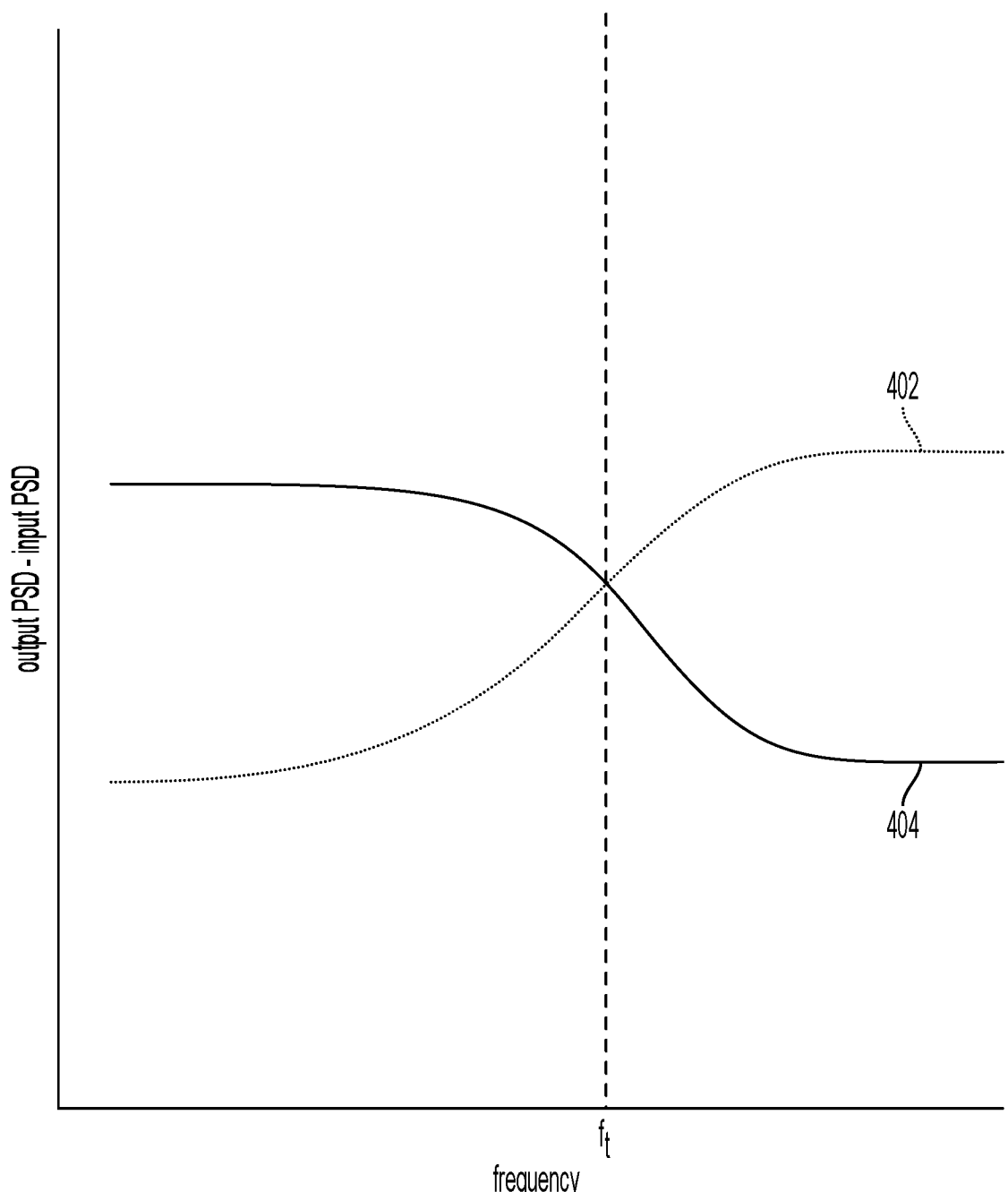
FIG. 4 depicts a plot of a difference between an output spectral density of a spectral tilt and the input power spectral density across frequency, according to an example.

Thus, the clarity of the audio output can be further tailored to the specific user by applying an equalization, such as a spectral tilt, to the signal. In the example of FIG. 2, spectral tilt 204, adjusted according to $t_{output}$, increases the gain of high frequencies and decreases the gain of low frequencies, or, when reversed, increases the gain of low frequencies and decreases the gain of high frequencies. An example of this shown in FIG. 4 which depicts the difference between the output PSD and the input PSD. At one end of the spectral tilt setting, the gain at frequencies below tilt frequency ft is decreased while above the tilt frequency ft, the gain is increased (represented by curve 402). At the other end of the spectral tilt setting, the gain at frequencies below the tilt frequency ft are increased while above the tilt frequency ft, the gain is increased (represented by curve 404). The spectral tilt addresses the needs of different listeners that might have hearing difficulties in the low ranges or in the high ranges by permitting the user to emphasize the signal at one end or the other.

While a spectral tilt has been shown to provide good results, other equalizations can be used to improve the clarity of the audio output. For example, the additional tailoring can increase high frequencies without reducing low frequencies or increase low frequencies without reducing high frequencies, although other audio equalizations are contemplated.

Figure 5:
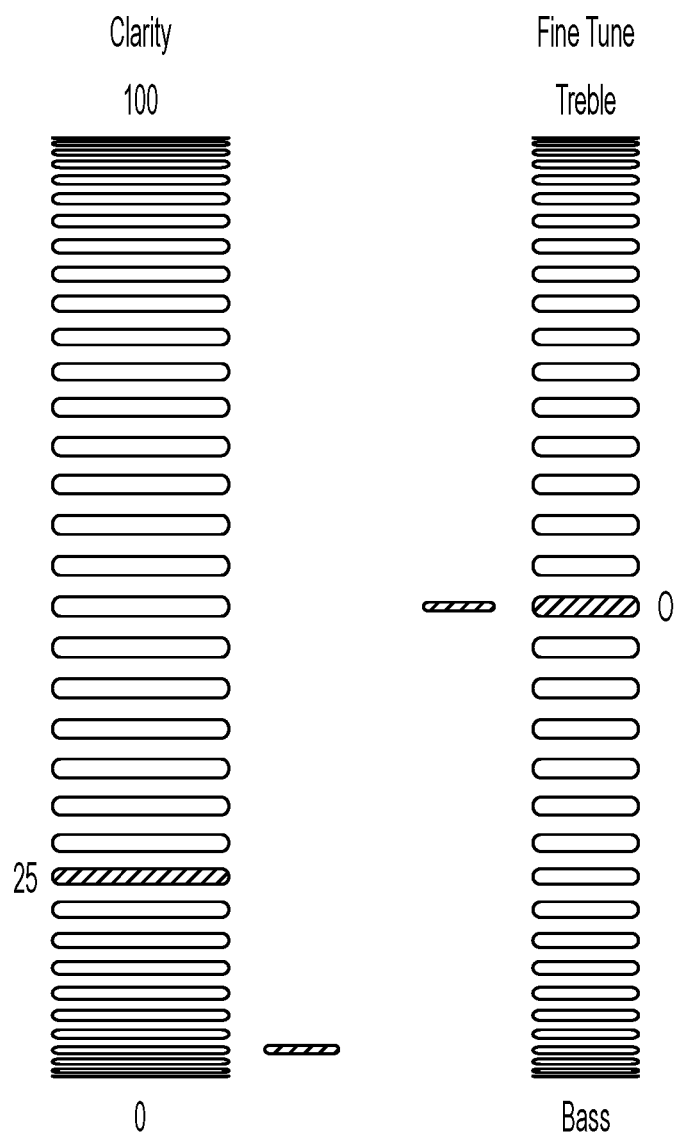
FIG. 5 depicts an interface for adjusting the clarity and fine tune of an audio output, according to an example.

As shown in FIG. 5, the clarity and spectral tilt can be presented to the user as a setting, each adjustable through an interface, such as a knob, a slider, a touch screen (e.g., in conjunction a dedicated or multipurpose program application), a remote control, or any other suitable interface. Both settings can be adjusted across a range of values. As an example, the lowest clarity setting could be 0 and the highest 100, with values selectable in-between, but it will be understood that the end points and intermediate values are arbitrary, and any suitable values can be selected. The additional tailoring of the clarity setting can likewise be implemented according to a user input and can be presented to the user an input titled "fine tune," "tuning," "treble/bass," or the like.

The signal processing chain is configured to provide at least one gain adjustment before applying the clarity setting. In the example of FIG. 1, the signal processing chain performs two gain adjustment operations on the input content signal u: (1) a volume-control gain adjustment at volume control 110, and (2) a noise-compensation gain adjustment at noise compensation 112.

The volume control 110 gain adjustment is representative of the volume control v, as set by a user. The volume control can be input according to an actuator or touch interface, located, for example, on a dashboard, or accessible through a remote control, or through other known methods.

Noise compensation 112 applies gain to content signal u to compensate for ambient noise, such as road noise, according to a noise-compensation algorithm. Simpler examples of noise compensation algorithms apply a uniform gain across frequency as the road noise increases within the cabin (e.g., in response to the vehicle speed, gear position, etc.). In more complex noise compensation algorithms, such as the Bose AudioPilot algorithm, the noise compensation can apply independent gains to respective bands of frequencies as the road noise increases.

Noise compensation 112 can be applied according to a road noise signal n indicative of the road noise in the vehicle cabin. In one example, road noise signal n can be an output from one or more microphones disposed within the vehicle cabin to detect road noise. Alternatively or additionally, road noise signal n can be a signal representative of the vehicle speed, gear position, or other metric output from the vehicle computer and indicative of road noise in the vehicle cabin.

Figure 6:
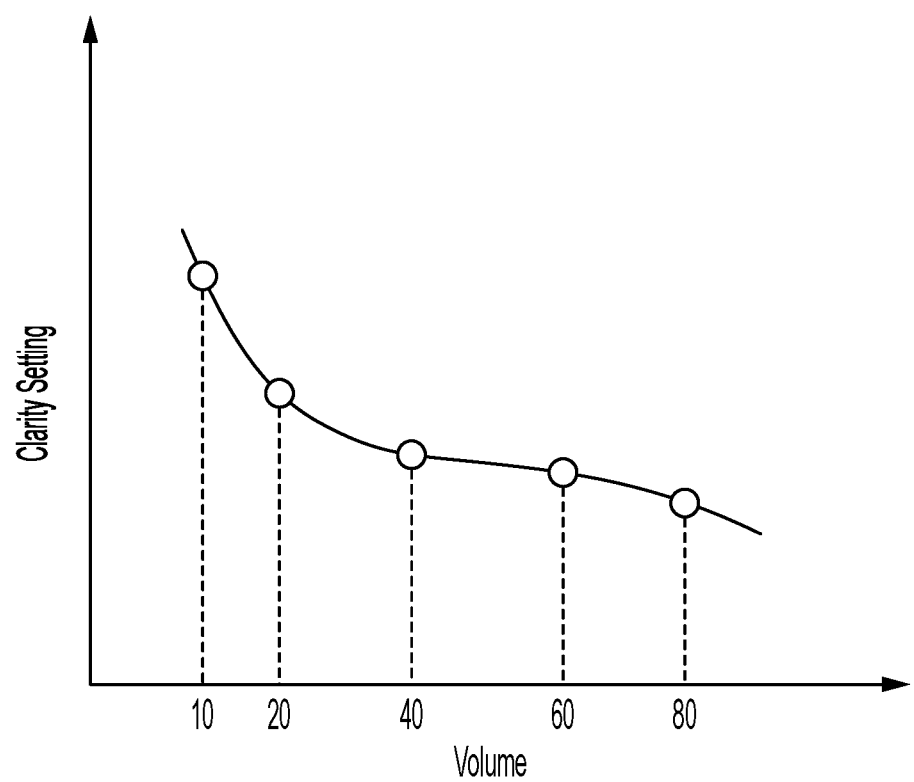
FIG. 6 depicts a plot of a volume and clarity mapping, according to an example.

Because the total gain of the output signal d relates to the signal to noise ratio and thus intelligibility of the output acoustic signal, it is necessary for parameter mapping 104 to take the applied gains into account. More generally, the clarity setting can be reduced as the gain increases to account for the increased signal-to-noise ratio. In the example of FIG. 1, parameter mapping 104 can receive the applied gain from volume control 110 as contextual parameter $p_1$ and reduce the clarity setting as the gain increases, through manipulation of the volume input. This can be accomplished through a predefined gain-clarity mapping, as shown in FIG. 6. The points of the gain-clarity mapping can be predefined as default setting—e.g., designed to maintain the same perceived clarity as the volume increases—through a set of user-defined points. (To avoid setting each point individually, the user can define two or more points and the remaining points can be determined through a suitable method of interpolation or extrapolation.) In either case, manipulation of the gain via the volume knob adjusts the clarity setting according to the mapping.

Figure 7:
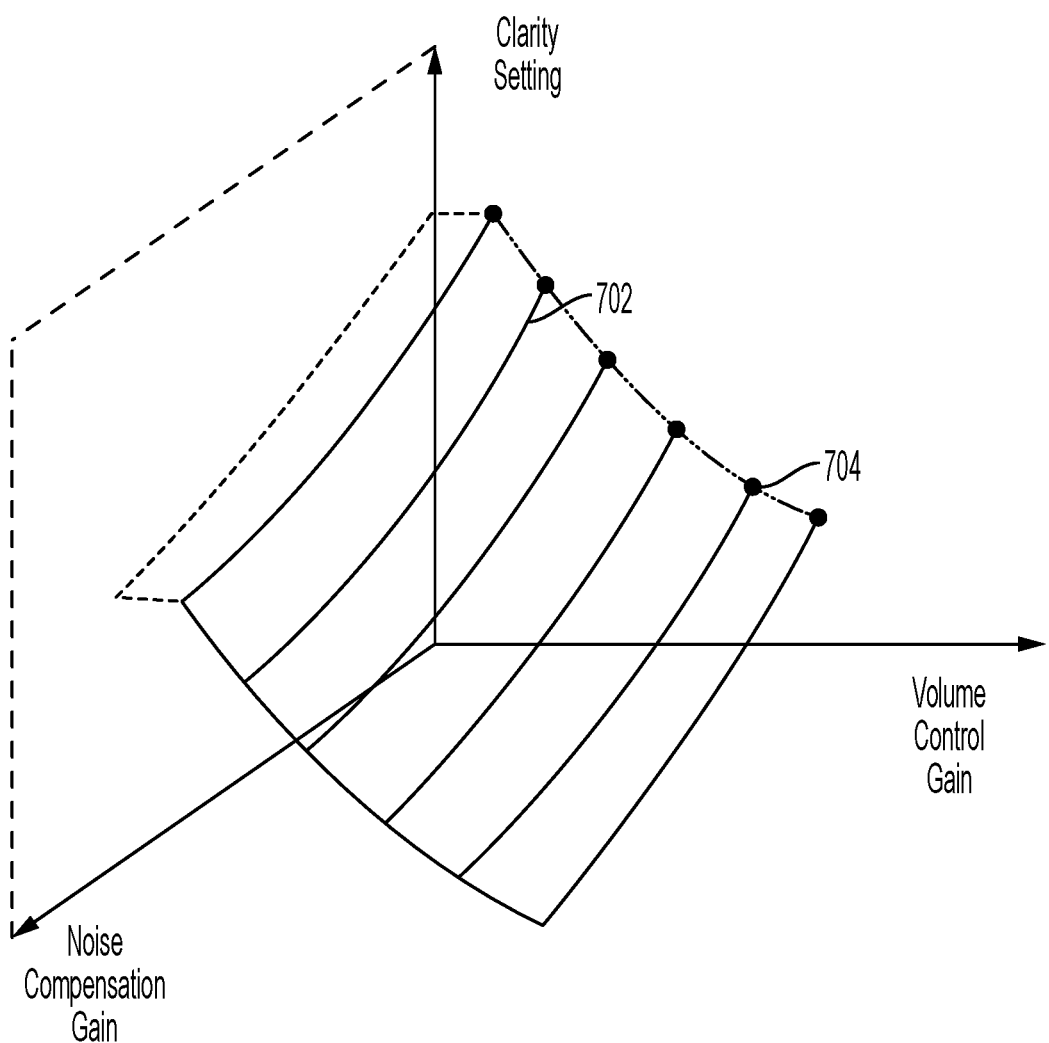
FIG. 7 depicts a plot of a volume, noise-compensation, and dependent clarity mapping, according to an example.

Parameter mapping 104 can further take into account the gain adjustment implemented by noise compensation 112, received as contextual parameter $p_2$. Since the gain adjustment implemented by noise compensation 112 already takes into account increased noise within the cabin, and because it is often applied in a frequency-dependent manner, a separate clarity mapping must be applied that takes into account the nature of the gain adjustment, the increased noise within the vehicle cabin, and the gain adjustment already implemented by volume control 110 to appropriately configure the clarity setting of clarity adjustment 102. FIG. 7 depicts a clarity mapping that takes into account both the gain adjustment from volume control 110 and noise compensation 112. The axis labeled "volume gain" is the gain-clarity mapping as represented in FIG. 6. On the axis labeled "noise-compensation gain" is an additional clarity mapping that is adjusted as the gain from the noise-compensation increases. In this example, the clarity as applied according to the gain parameters $p_1$ and $p_2$ will thus ride along the surface created by the gain-clarity mappings of volume and noise compensation.

In an example, the shape of the surface of the plot of FIG. 7 is determined by equal "intelligibility" contours. Stated differently, contours of the surface of FIG. 7 are determined such that, for a given volume, intelligibility of the audio output is approximately maintained across different noise-compensation gains. For example, at volume setting "20," when the vehicle is stationary, noise compensation 112 applies no gain to the signal. As the car begins moving and road noise increases, noise compensation 112 begins to apply gain in at least one frequency band. Assuming that the user does not adjust the volume knob, the clarity will be adjusted along contour 702 according to the gain applied by noise compensation 112. As the user adjusts the volume, the clarity setting is determined at the new contour—e.g., if the user turns the volume to "80," the clarity setting is determined along contour 704 according to the gain applied by noise compensation 112. Generally, noise compensation 112 gain is low at higher volumes and high for lower volumes, and so a smaller adjustment to the clarity setting is required to maintain clarity at the desired amount as the volume increases.

Further, it should be understood that other gain adjustments can be made in addition to volume control and noise compensation gain adjustments. For example, audio equalizations can be implemented to just the quality of the audio output (e.g., to adjust bass, midrange, or treble according to a user's preferences) and can be taken into account by parameter mapping 104 through appropriate adjustments to the clarity setting.

Although the contextual parameters $p_1$ and $p_2$ are shown as received from volume control 110 and noise compensation 112, it should be understood that, in various examples, the parameters representing the gain applied to the content signal u can be detected from the signal rather than received directly as parameters. For example, the gain applied to the signal can be detected by comparing the signal input to and output from the amplifier of volume control 110 or input to and output from the amplifier of noise compensation 112. Alternatively, the volume input v or the noise signal n can be input to parameter mapping to determine what gain would be applied by volume control v or noise compensation n according to those inputs. In this example, volume input v or road noise signal n could be considered the contextual parameters, since they are used by parameter mapping 104 as proxies for the gain applied—parameter mapping 104 repeating the same calculations or adjustments performed by volume control 110 and noise compensation 112 to determine the gains applied by each.

Figure 8:
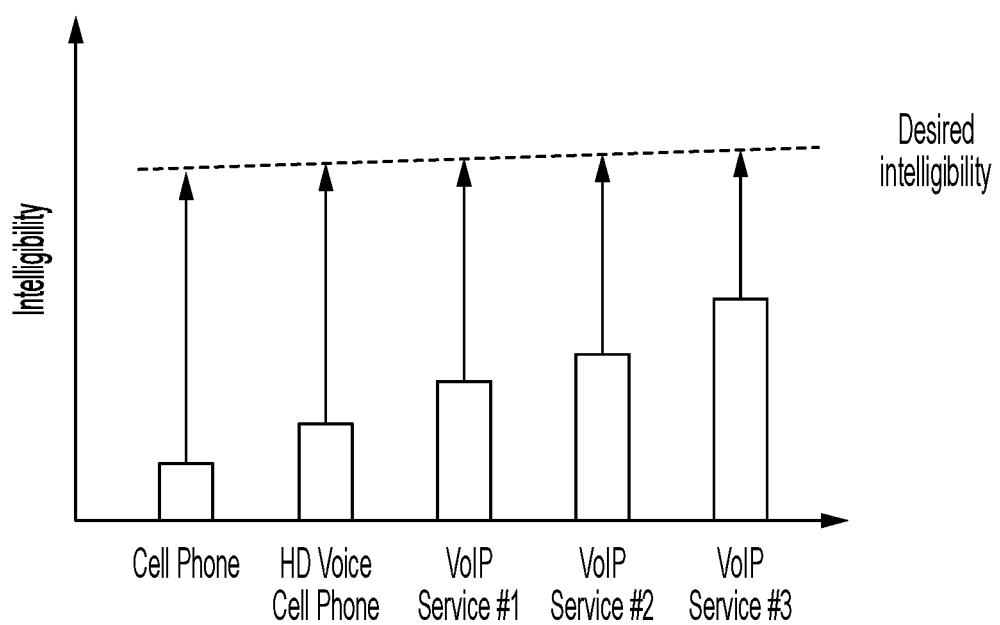
FIG. 8 depicts a bar graph of the intelligibility, according to bandwidth, of various typical signals.

In addition to gain adjustments, the character of the content signal u determines the need for a clarity adjustment to maintain clarity at a desired amount. For example, generally, intelligibility decreases with bandwidth. Cell phone calls tend to have low bandwidth, whereas various voice over IP services have been shown to have higher but varying bandwidths. Streaming services, such as podcasts, or audio files such as audiobooks, tend to have very high bandwidth. FIG. 8 depicts the intelligibility of various input signals. As shown, cell phone calls tend to have the lowest bandwidth and thus the lowest intelligibility. HD cell phone calls have higher bandwidth and higher intelligibility. These two are followed by three voice over IP services of various bandwidths: VoIP Service #1, VoIP Service #1, VoIP Service #1. In this example, VoIP Service #1 has the lowest bandwidth and thus the lowest intelligibility of the VoIP services; whereas, VoIP Service #3 has the highest bandwidth and thus the highest intelligibility. Generally speaking, very high-quality signals have a bandwidth of greater than or equal to 16 kHz, with quality and intelligibility diminishing as bandwidth decreases from that value.

Figure 9:
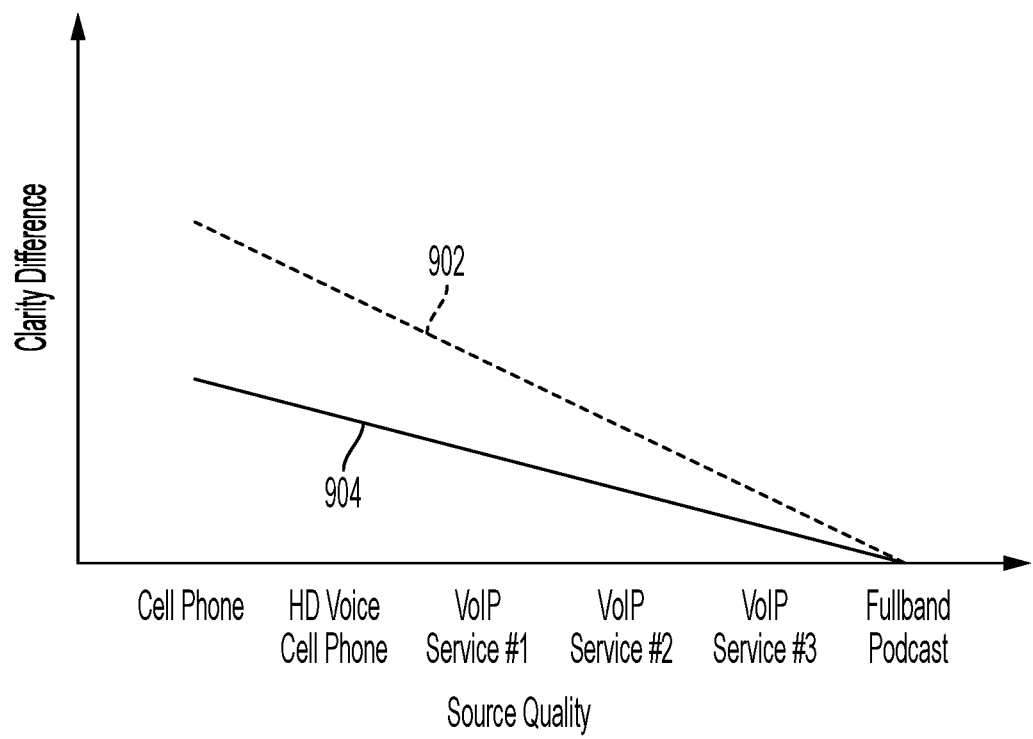
FIG. 9 depicts a clarity difference as determined by the bandwidth of various input signals, according to an example.

As shown in FIG. 1, bandwidth detection 114 receives and determines the bandwidth of content signal u, according to any suitable bandwidth detection method, and outputs contextual parameter $p_3$ representative of the bandwidth of content signal u to parameter mapping 104. To maintain intelligibility at the desired amount, i.e., according to the clarity input, parameter mapping 104 makes a larger clarity adjustment (i.e., the clarity setting is set to a higher amount) to low bandwidth signals and a lower clarity adjustment (i.e., the clarity setting is set to a lower amount) to high bandwidth signals. This is represented in FIG. 8 by the "desired intelligibility" line. Each signal receives a different clarity adjustment (represented by the respective arrows) dependent on the bandwidth of the signal. FIG. 9 represents an example of an adjustment to the clarity and fine tune settings for signals of different bandwidths (in addition to the clarity and fine tune settings already applied according to other factors in view of the clarity input). While fine tune adjustment, as described herein, is typically used as a method of tailoring the implementation of the clarity setting, Applicant has recognized increasing the treble and reducing the bass of lower bandwidth signals generally improves intelligibility. Thus, as shown in FIG. 9, the clarity setting (e.g., the parameters of a dynamic range compression), represented by line 902, is higher for lower bandwidth signals and linearly decreases until, for very high-quality signals such as full-band podcasts, no clarity adjustment is made beyond the clarity setting already determined according to other factors in view of the clarity input. Likewise, the amount of spectral tilt, represented by line 904, represents that the treble is increased and the bass decreased for low quality signals, but linearly adjusted back to no additional spectral tilt for the fullband podcasts.

Regardless of the quality of the signal, no amount of gain need be applied outside of the audio bandwidth of the signal. As there is typically unwanted noise present out of band, it is generally desirable to avoid applying any gain increase outside of the bandwidth of the signal. Indeed, thresholding can be applied to frequencies outside of the bandwidth, at which no gain is applied or at which the signals are removed to reduce any unwanted sounds such as hissing present outside of the audio bandwidth. Additionally, such thresholding can be applied within the bandwidth of the signal to remove or to avoid increasing the gain of any signals below a predetermined threshold selected for signals that are likely noise.

Since the clarity adjustment, as described in this disclosure, is designed for use with increasing the clarity of spoken word audio outputs, it is generally not desirable to apply the clarity adjustment to music or other types of audio as it can alter the output in ways that can decrease the quality of the music. Accordingly, parameter mapping 104 can receive, as contextual parameter $p_4$, an output from content-type detection 116, which detects whether the content signal u is a spoken word audio output or other type of audio output. In an example, content-type detection 116 can use a suitable voice-activity algorithm to detect the presence of a spoken word audio output. In alternative examples, methods for detecting the presence of music, such as detecting spectral distributions that are characteristic of music outputs, can be used.

Figure 10:
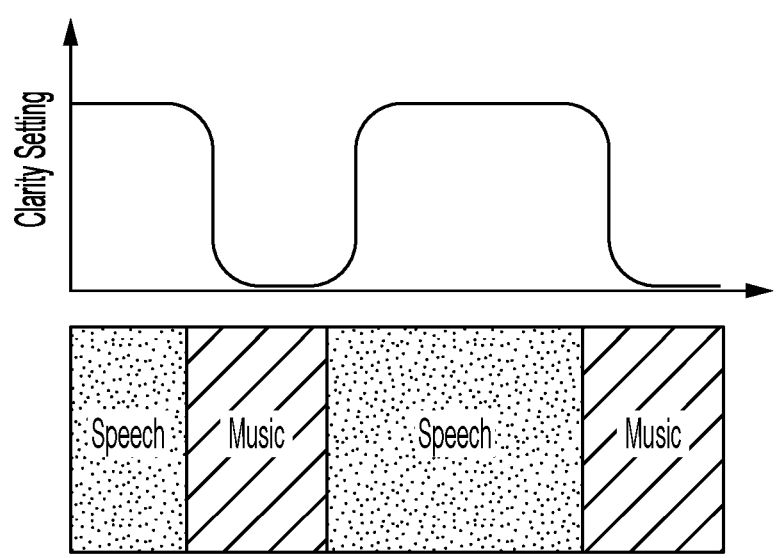
FIG. 10 depicts a clarity setting as content type is changed between a spoken word signal and a music signal, according to an example.

Parameter mapping 104 can, accordingly, reduce the clarity setting when music is detected. An example of this is shown in the plot depicted in FIG. 10. When speech is detected, the clarity setting is set according to the desired intelligibility of the clarity input $c_{input}$. When music is detected the clarity setting is reduced to zero, or to some small value. In some examples, the value to which clarity is applied to a music audio output can be a user-defined parameter that applies an absolute clarity setting value or can be a reduction in the clarity setting (i.e., a reduction to the clarity setting as it has been determined by other parameters and the clarity input). For example, a user can determine whether to apply 100%, 50%, etc., reduction in the clarity setting in the presence of music.

It should also be understood that the clarity setting can be applied to safety warning signals, such as blind spot warning, seatbelt warning, proximity warnings, etc. In an example, these types of warning signals can be detected, through any suitable means or by a signal sent from the computer or system generating the warning signal, by controller 108, which can apply to the warning signal the clarity setting. The clarity setting applied to the warning signal can be the same as applied to spoken word outputs or can be applied according to an amount determined by the user (either absolute setting or as a reduction to the clarity setting as otherwise applied to spoken word outputs).

Figure 11A:
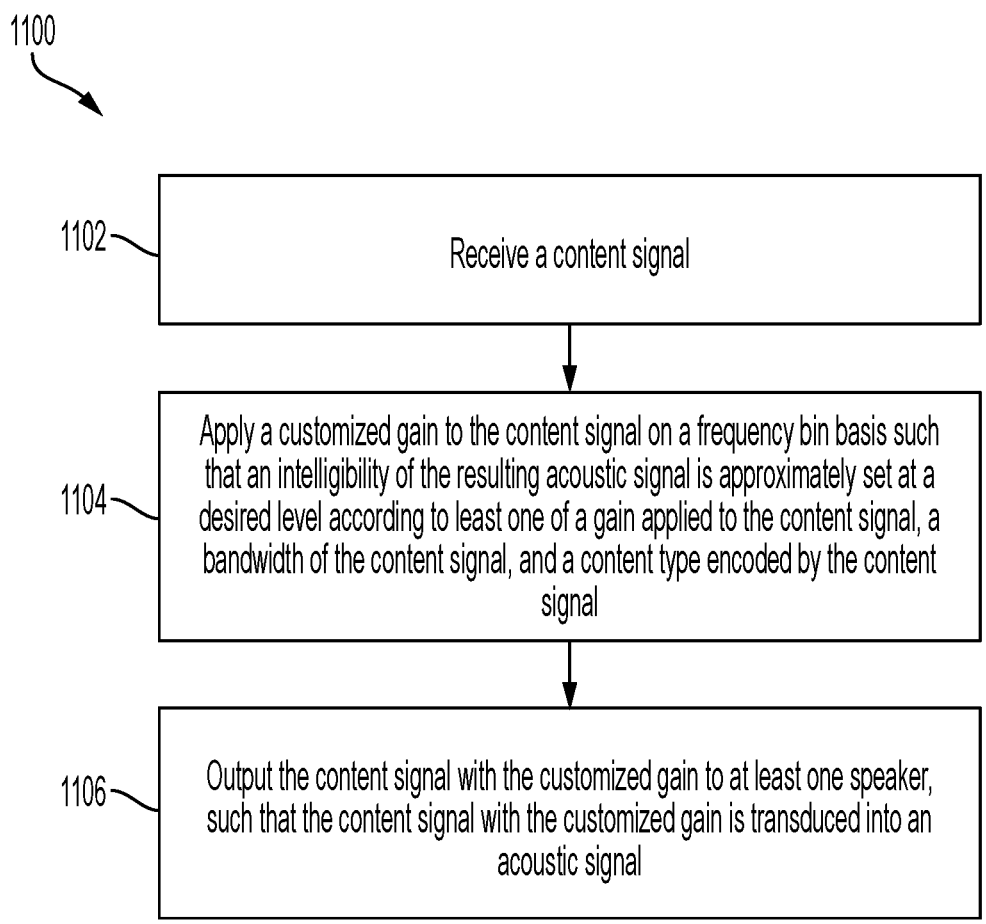
FIG. 11A depicts a flowchart of a method for adjusting the clarity of an audio output in a dynamic environment, according to an example.

FIG. 11A depicts a flowchart of a method 1100 for adjusting the clarity of an audio output in a dynamic environment. Method steps 1100 can be performed by a controller (such as controller 108) comprising one or more processors and any associated hardware. Method steps 1100 can be further stored in one or more non-transitory storage media and executed by the controller.

At step 1102, a content signal is received. The content signal can include one more gain adjustments applied, for example, by an amplifier in accordance with a volume control and/or in accordance with a noise compensation algorithm such as Bose AudioPilot. In the latter instance, it should be understood that the gain adjustment can comprise multiple gain adjustments applied across different frequency bands.

At step 1104, a customized gain is applied to the content signal on a frequency bin basis such that an intelligibility of the resulting acoustic signal (e.g., as output in step 1106) is set approximately at a desired level according to least one of a gain applied to the content signal, a bandwidth of the content signal, and a content type encoded by the content signal. The customized gain is selected so that softer sounds may be enhanced (e.g., brought up in level or volume relative to louder sounds), and/or louder sounds reduced (e.g., brought down in level or volume relative to softer sounds). The desired level is determined by a default setting or by received user input.

In an example, the customized gain (i.e., the clarity setting) can be implemented, at least in part, by dynamic range compression and a spectral tilt. In this example, clarity setting can be adjusted by changing the parameters of a dynamic range compression—e.g., the implemented thresholds, associated gain reductions, etc.—in a manner designed to improve the intelligibility of the spoken word output according to the desired intelligibility.

While a dynamic range compression that improves intelligibility for an average user can be determined theoretically or empirically, the resulting dynamic range compression will not improve intelligibility for every user. Certain users might experience hearing difficulty in atypical ways and a dynamic compression tailored for the average user will not address the way in which a given user perceives spoken word content. Thus, the clarity of the audio output can be further tailored to the specific user by applying an equalization, such as a spectral tilt, to the signal. The spectral tilt addresses the needs of different listeners that might have hearing difficulties in the low ranges or in the high ranges by permitting the user to emphasize the signal at one end or the other. Although a spectral tilt has been shown to provide good results, other equalizations can be used to improve the clarity of the audio output. For example, the additional tailoring can increase high frequencies without reducing low frequencies or increase low frequencies without reducing high frequencies, although other audio equalizations are contemplated.

Figure 11B:
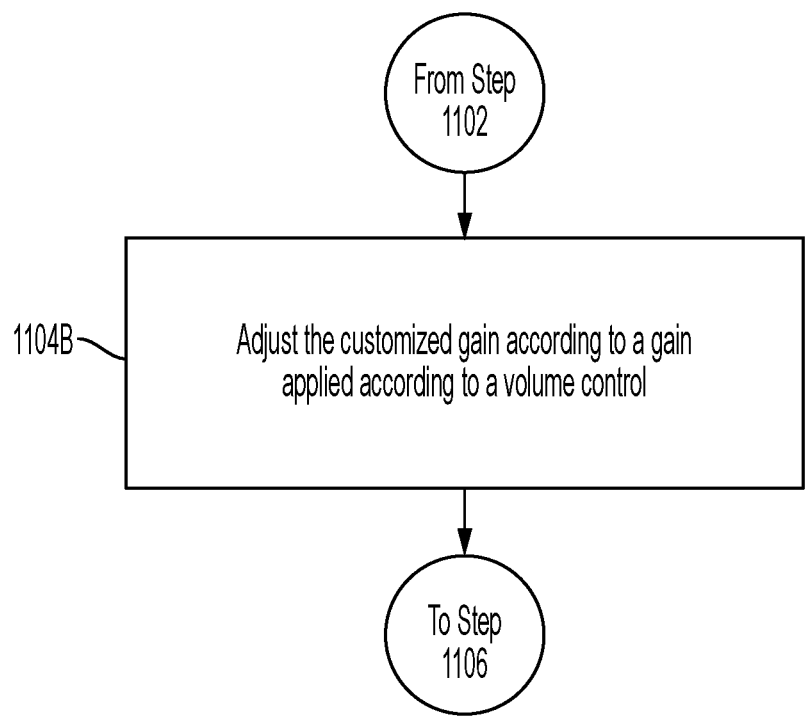
FIG. 11B depicts a flowchart of a method for adjusting the clarity of an audio output in a dynamic environment, according to an example.

As described above, the customized gain is applied according to one or more gain adjustments, as applied, for example, in accordance with a volume control. Thus, as shown in FIG. 11B, step 1104 can further comprise sub-step 1104B, in which the customized gain is adjusted according to the gain applied to the content signal according to a volume control. In an example, the gain adjustment applied to the content signal according to the volume control can be determined from a received parameter (e.g., a volume control input from user) or by comparing a signal input to and output from the amplifier that adjusts the gain according to the desired volume.

The customized gain can be adjusted through a predefined gain-clarity mapping (e.g., described above in conjunction with FIG. 6). The points of the gain-clarity mapping can be predefined as default setting—e.g., designed to maintain the same perceived clarity as the volume increases—or through a set of user-defined points. (To avoid setting each point individually, the user can define two or more points and the remaining points can be determined through a suitable method of interpolation or extrapolation.) In either case, manipulation of the gain via the volume knob adjusts the clarity setting according to the mapping.

Figure 11C:
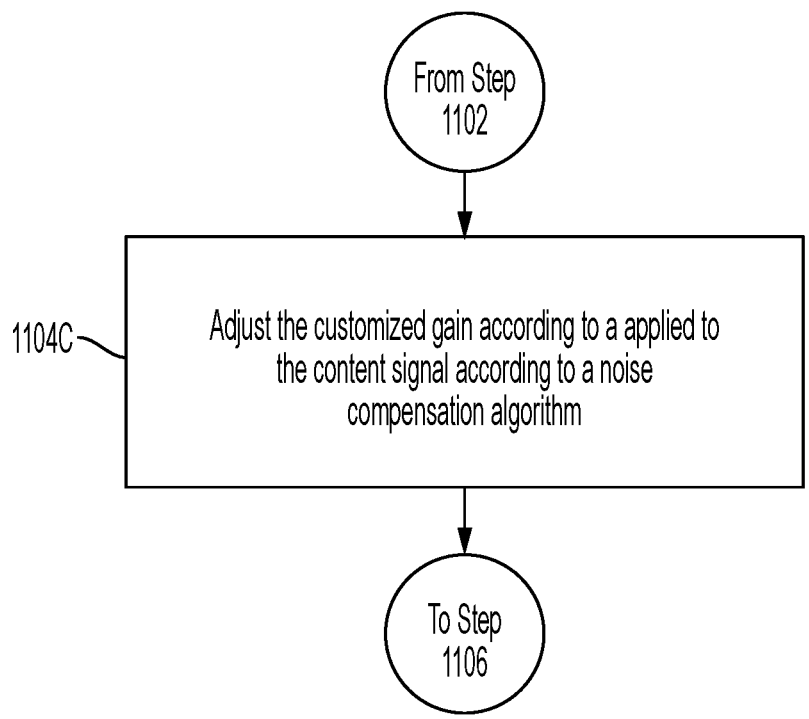
FIG. 11C depicts a portion of a flowchart of a method for adjusting the clarity of an audio output in a dynamic environment, according to an example.

The customized gain further takes into account the gain adjustment implemented according to a noise compensation algorithm. Thus, as shown in FIG. 11C, step 1104 can further comprise sub-step 1104C, in which the customized gain is adjusted to the gain applied to the content signal according to a noise compensation algorithm. Similar to the volume gain adjustment, the gain adjustment applied to the content signal according to the noise compensation can be determined from a received parameter (e.g., an output from the noise compensation algorithm) or by comparing a signal input to and output from the amplifier that adjusts the gain according to the noise compensation algorithm.

Since the gain adjustment implemented by noise compensation already takes into account increased noise within the cabin, and because it is often applied in a frequency-dependent manner, a separate clarity mapping (e.g., as described in conjunction with FIG. 7) must be applied that takes into account the nature of the gain adjustment, the increased noise within the vehicle cabin, and the gain adjustment already implemented by volume gain adjustment to appropriately adjust the clarity setting. As shown in FIG. 7, the additional mapping can be determined by equal intelligibility contours, along which, for a given volume setting, the customized gain is adjusted to that the intelligibility remains approximately the same as the road noise increases and the noise compensation algorithm adjusts the gain accordingly.

Further, it should be understood that other gain adjustments can be made in addition to volume control and noise compensation gain adjustments. For example, audio equalizations can be implemented to just the quality of the audio output (e.g., to adjust bass, midrange, or treble according to a user's preferences) and can be taken into account when adjusting the customized gain to arrive the desired intelligibility.

Figure 11D:
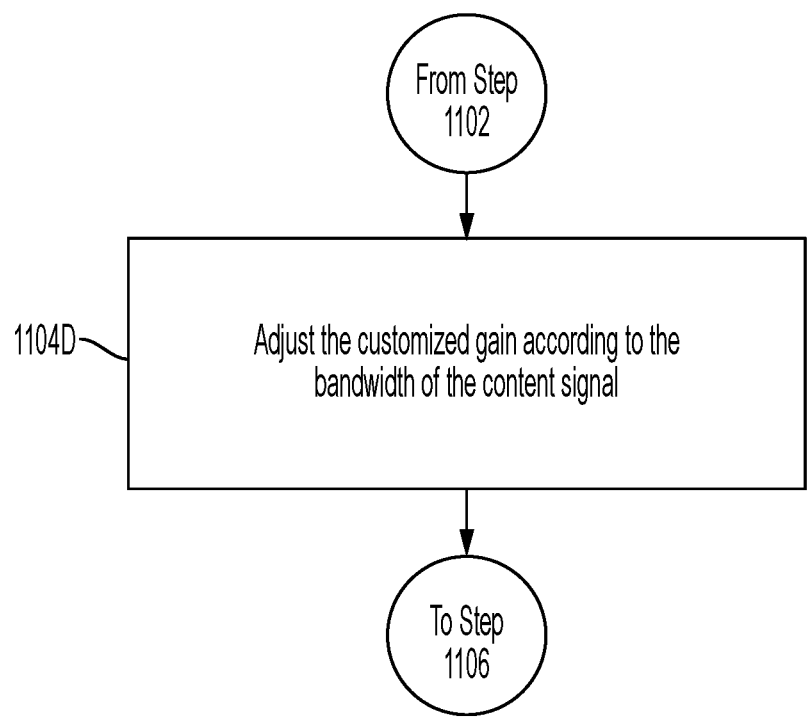
FIG. 11D depicts a portion of a flowchart of a method for adjusting the clarity of an audio output in a dynamic environment, according to an example.

The customized gain can further take into account the bandwidth of the content signal. Thus, as shown in FIG. 11D, step 1104 can include the sub-subject 1104D: in which the customized gain is adjusted according to the bandwidth of the content signal. The bandwidth of the signal can be determined according to any suitable method.

To adjust the customized gain such that the output acoustic signal approximates the desired intelligibility, a larger clarity adjustment (i.e., the clarity setting is set to a higher amount) can be made to low bandwidth signals and a lower clarity adjustment (i.e., the clarity setting is set to a lower amount) to high bandwidth signals. As described in conjunction with FIG. 9 the clarity setting, represented by line 902, is adjusted to be higher for lower bandwidth signals and linearly decreases until, for very high-quality signals such as fullband podcasts, no additional clarity adjustment is made. Likewise, the amount of spectral tilt, represented by line 904, represents that the treble is increased and the bass decreased for low quality signals, but linearly adjusted back to no additional spectral tilt for the fullband podcasts.

Regardless of the quality of the signal, no amount of gain need be applied outside of the audio bandwidth of the signal. As there is typically unwanted noise present out of band, it is generally desirable to avoid applying any gain increase outside of the bandwidth of the signal. Indeed, thresholding can be applied to frequencies outside of the bandwidth, at which the no gain is applied or at which the signals are removed to reduce any unwanted sounds such as hissing present outside of the audio bandwidth. Additionally, such thresholding can be applied within the bandwidth of the signal, to remove or to avoid increasing the gain of any signals below a predetermined threshold selected for signals that are likely noise.

Figure 11E:
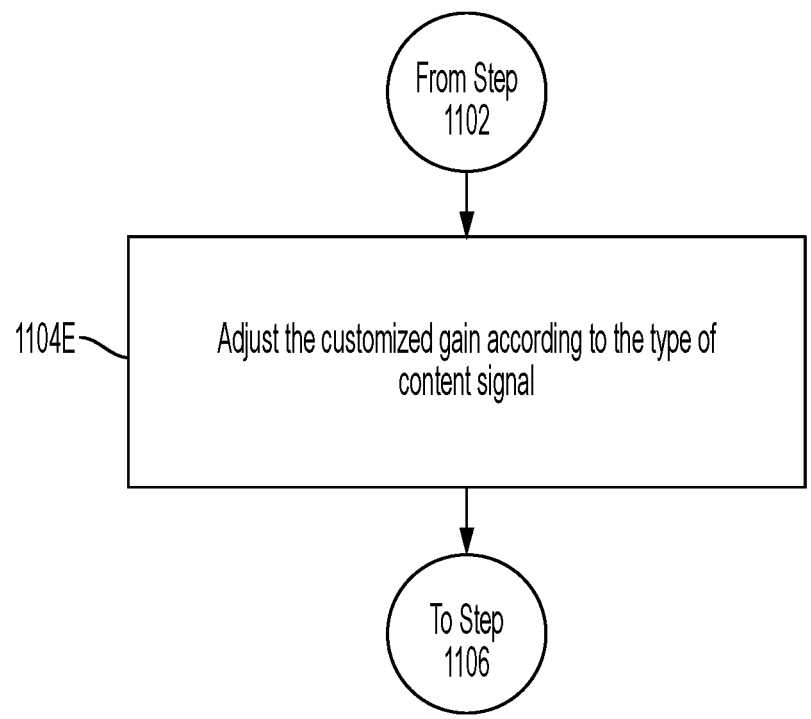
FIG. 11E depicts a portion of a flowchart of a method for adjusting the clarity of an audio output in a dynamic environment, according to an example.

Further, the customized gain can be adjusted according to the type of the content signal (e.g., spoken word audio signal or music). Thus, as shown in FIG. 11E, step 1104 can include sub-step 1104E: adjust the customized gain according to the type of content signal. The content type can be determined according to any suitable method, such as through voice-activity detection algorithms or through identifying spectral content typically associated with music.

When speech is detected, the clarity setting is set according to the desired intelligibility of the clarity input (which pertains to the desired clarity of the spoken word outputs). When music is detected the clarity setting is reduced to zero, or to some small value. In some examples, the value to which a customized gain is applied to a music audio output is a user-defined parameter that applies an absolute clarity setting value or a reduction in clarity setting as determined by other parameters. For example, a user can determine whether to apply 100%, 50%, etc., reduction to the clarity setting in the presence of music.

At step 1106, the content signal with the customized gain is output to at least one speaker for transduction into an acoustic signal. This step can further include the steps of applying beamforming, routing to various speakers, etc. It should be understood that those processes applied to the signal after the customized gain is applied are typically those that do not materially impact the intelligibility of the acoustic signal as heard by the user(s).

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the inventive scope of the present disclosure.

What is claimed is:

1. A method for adjusting the clarity of an audio output in a changing environment, comprising:
    receiving a content signal;
    applying a customized gain to the content signal; and
    outputting the content signal with the customized gain to at least one speaker for transduction to an acoustic signal, wherein the customized gain is based on a dynamic range compression applied on a per frequency bin basis such that, at least, frequency bins having magnitudes less than a respective predetermined threshold are enhanced and that an intelligibility of the acoustic signal is set approximately at a desired level, wherein the customized gain is determined according to a mapping that relates the customized gain to at least one of a gain applied to the content signal, a bandwidth of the content signal, or a content type encoded by the content signal.

2. The method of claim 1, wherein the customized gain is further based on an equalization.

3. The method of claim 2, wherein the equalization is a spectral tilt.

4. The method of claim 1, wherein the gain applied to the content signal is set according to a volume control.

5. The method of claim 1, wherein the audio output is generated within a vehicle cabin, wherein the gain is set, at least in part, according to road noise within the vehicle cabin and according to a volume control.

6. The method of claim 5, wherein the gain set according to the road noise within the vehicle cabin is comprised of a set of frequency-dependent gain adjustments.

7. The method of claim 1, wherein the dynamic range compression is only performed within the bandwidth of the signal.

8. The method of claim 1, wherein the content type is one of music or a spoken-word output.

9. The method of claim 1, wherein the content type is detected according to a voice-activity detection algorithm.

10. A non-transitory storage medium comprising program code that, when executed by a processor, adjusts the clarity of an audio output in a changing environment, the program code comprising the steps of:
    receiving a content signal;
    applying a customized gain to the content signal; and
    outputting the content signal with the customized gain to at least one speaker for transduction to an acoustic signal, wherein the customized gain is based on a dynamic range compression applied on a per frequency bin basis such that, at least, frequency bins having magnitudes less than a respective predetermined threshold are enhanced and that an intelligibility of the acoustic signal is set approximately at a desired level, wherein the customized gain is determined according to a mapping that relates the customized gain to at least one of a gain applied to the content signal, a bandwidth of the content signal, or a content type encoded by the content signal.

11. The non-transitory storage medium comprising program code of claim 10, wherein the customized gain is further based on an equalization.

12. The non-transitory storage medium comprising program code of claim 11, wherein the equalization is a spectral tilt.

13. The non-transitory storage medium comprising program code of claim 10, wherein the gain applied to the content signal is set according to a volume control.

14. The non-transitory storage medium comprising program code of claim 10, wherein the audio output is generated within a vehicle cabin, wherein the gain is set, at least in part, according to road noise within the vehicle cabin and according to a volume control.

15. The non-transitory storage medium comprising program code of claim 14, wherein the gain set according to the road noise within the vehicle cabin is comprised of a set of frequency-dependent gain adjustments.

16. The non-transitory storage medium comprising program code of claim 10, wherein the dynamic range compression is only performed within the bandwidth of the signal.

17. The non-transitory storage medium comprising program code of claim 10, wherein the content type is one of music or a spoken-word output.

18. The non-transitory storage medium comprising program code of claim 10, wherein the content type is detected according to a voice-activity detection algorithm.

* * * * *